United States Patent [19]

Morrell

[11] Patent Number: 5,608,609
[45] Date of Patent: Mar. 4, 1997

[54] OUTDOOR CABINET FOR ELECTRONIC EQUIPMENT

[75] Inventor: Edward A. Morrell, Randolph, N.J.

[73] Assignee: Lucent Technologies Inc., Murray Hill, N.J.

[21] Appl. No.: 526,618

[22] Filed: Sep. 11, 1995

[51] Int. Cl.⁶ .................................................. H05K 7/20
[52] U.S. Cl. ........................................ 361/690; 361/826
[58] Field of Search ................................. 361/679, 688, 361/690–697, 724–727, 822, 823, 826, 831

[56] References Cited

U.S. PATENT DOCUMENTS

| 4,359,085 | 11/1982 | Mueller | 361/694 |
| 4,495,780 | 1/1985 | Kaneko et al. | 361/688 |
| 4,535,386 | 8/1985 | Frey, Jr. et al. | |
| 5,150,277 | 9/1992 | Bainbridge et al. | |
| 5,450,272 | 9/1995 | Van Gaal et al. | 361/690 |

FOREIGN PATENT DOCUMENTS

| 1253997 | 10/1989 | Japan. | |
| 4015999 | 1/1992 | Japan | 361/694 |

*Primary Examiner*—Gregory D. Thompson
*Attorney, Agent, or Firm*—Lester H. Birnbaum

[57] ABSTRACT

Disclosed is a cabinet for housing electronic equipment. The cabinet includes a sealed first portion enclosing circuit packs such as those used for broadband and narrowband telecommunications transmission. The second portion is ventilated and encloses electrical components such as coaxial cable hardware.

9 Claims, 3 Drawing Sheets

OUTDOOR CABINET FOR ELECTRONIC EQUIPMENT

BACKGROUND OF THE INVENTION

This invention relates to a cabinet for housing electronic equipment.

In most telecommunications systems, it is necessary to house sophisticated electronic equipment outdoors in the vicinity of a group of subscribers. One example of such a cabinet is the remote terminal in a Subscriber Loop Carrier (SLC®) system. Another example is the distant terminal required in hybrid fiber coax systems which requires both narrowband and broadband electronic equipment.

A problem which must be addressed with such cabinets is how to most effectively cool the electronics. One approach is to provide fans in the cabinet in combination with a heat exchanger located near the equipment. (See U.S. Pat. No. 5,150,277 issued to Bainbridge et al.) While such an approach is effective, fans tend to add considerable expense to the cost of the cabinet. Thus, proposals have been made to rely on natural convection in combination with a heat exchanger and/or cooling fins, the cooling fins being provided in a ventilated portion of the cabinet. (See, e.g., U.S. Pat. No. 4,535,386 issued to Frey Jr. et al., and Japanese Laid open Patent 1-253997 published Oct. 11, 1989 in the name of Kimura.)

It is desirable to provide a cabinet which efficiently and economically cools electronic components housed therein.

SUMMARY OF THE INVENTION

The invention is a cabinet comprising a first portion which is sealed from the outside environment and includes a plurality of circuit packs mounted therein. A second portion is provided adjacent to the first portion and separated therefrom by a wall. The second portion is ventilated and includes mounted therein components electrically connected to the circuit packs in the first portion.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
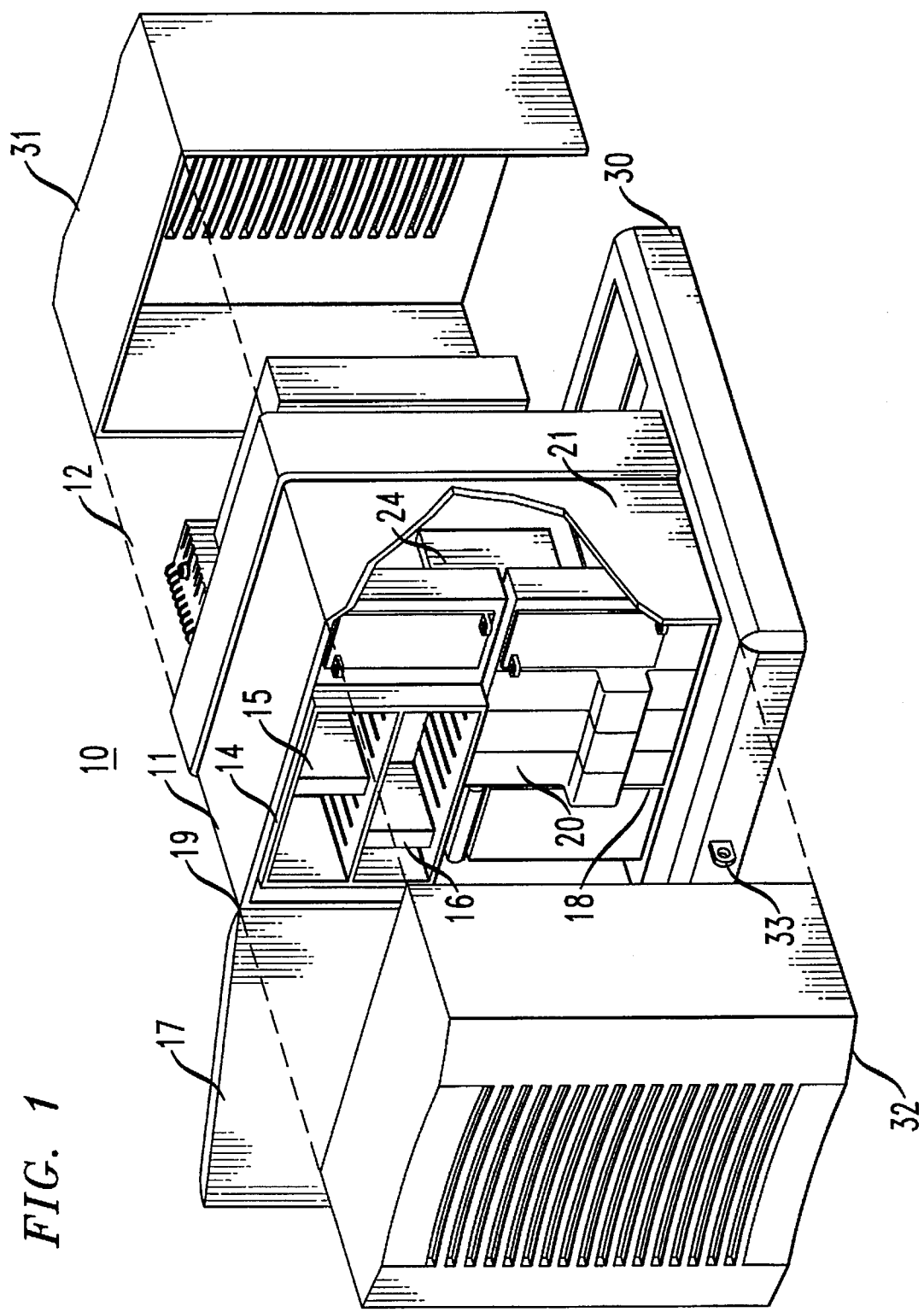
FIG. 1 is an exploded, perspective, schematic view illustrating primarily one side of a cabinet in accordance with one embodiment of the invention.
Figure 2:
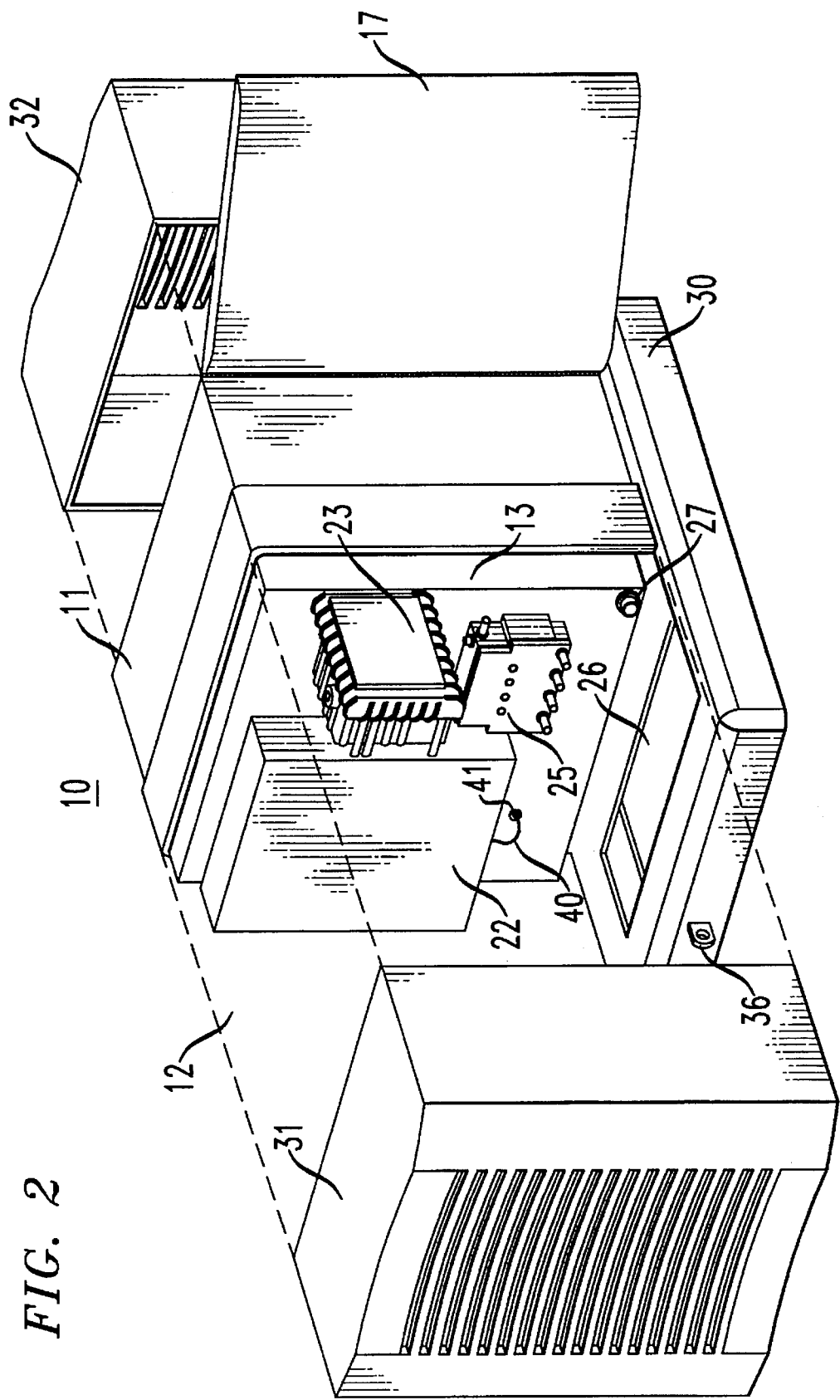
FIG. 2 is an exploded, perspective, schematic view of the same cabinet illustrating essentially another side of the cabinet.
Figure 3:
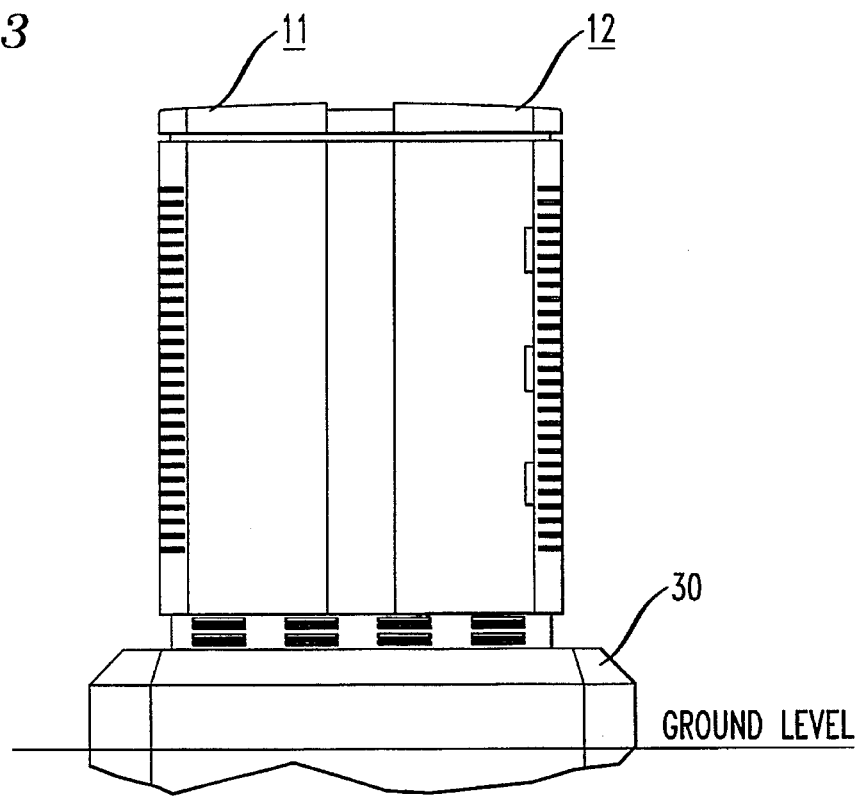
FIG. 3 is a side view of the cabinet of FIGS. 1 and 2.

As illustrated in the exploded views of FIGS. 1 and 2, the cabinet, 10, includes two portions, 11 and 12, which are preferably adjacent and separated by a wall, 13. Portion 11 includes therein a plurality of shelves, e.g., 14, within which are mounted a plurality of circuit packs, e.g., 15 and 16, which are a standard type well known in the art. In this particular example, the upper shelf, 14, of portion 11, includes the circuit packs (e.g., 15 and 16) for narrowband transmission, and the lower shelf, 18, includes the circuit packs (e.g., 20) for broadband transmission, but other arrangements are possible. The various circuit packs are accessed on one end of the cabinet by a door, 17, which is mounted to the rear of the cabinet by means of hinges, e.g., 19. An optical fiber organizer, 24, may also be mounted within portion 11 to store optical fibers (not shown) which can carry, for example, telephone and switched digital video signals.

FIGS. 1 and 2 illustrate the access door, 17, in an opened position. When the door is closed, fasteners (not shown) such as screws, are used to secure the door to corresponding hasps (not shown). When in the closed position, the door, 17, along with the side surfaces, e.g., 21, and the wall, 13, form a weather-tight seal so that the circuit packs, e.g., 15, 16, and 20, and optical fiber organizer, 24, are protected against the outside environment.

As further illustrated in FIG. 2, the other portion, 12, of the cabinet includes additional electrical components, such as a standard cross-connect apparatus shown schematically as block 22. The cross-connect apparatus can include insulation displacement contacts or binding posts to provide electrical connection from the components in portion 11 to the individual customers by means of one or more output cables (not shown) which exit the cabinet through a hole, 26, in the base, 30. The cross-connect apparatus, 22, is coupled to the circuit packs, e.g., 15 and 16, by means of a narrow wire (40) passing through a grommetted aperture (41) in the wall, 13.

Portion 12 also includes standard coaxial cable TV hardware such as a coaxial amplifier, 23, and a plurality of taps, 25, for amplifying and separating rf signals from an incoming coaxial cable (not shown) so the signals can be sent to individual customers through an output coaxial cable (not shown). Again, the input and output coaxial cables would be fed through hole, 26, in the base. The cross-connect and CATV components differ from the circuit packs, 15 and 16, primarily in the fact that the cross-connect and CATV components may be exposed to the outside environment without any significant adverse consequences. The portion, 12, may further include a coaxial connector, 27, for receiving wires (not shown) which carry power from an incoming coaxial cable through hole, 26, to the components in portion 11.

The wall, 13, separating the two portions, 11 and 12, can be made of a metal such as aluminum or steel which conducts heat away from portion, 11, to provide cooling for the components therein. If desired, although more expensive, a heat exchanger could be mounted or built into the wall, 13.

Figure 4:
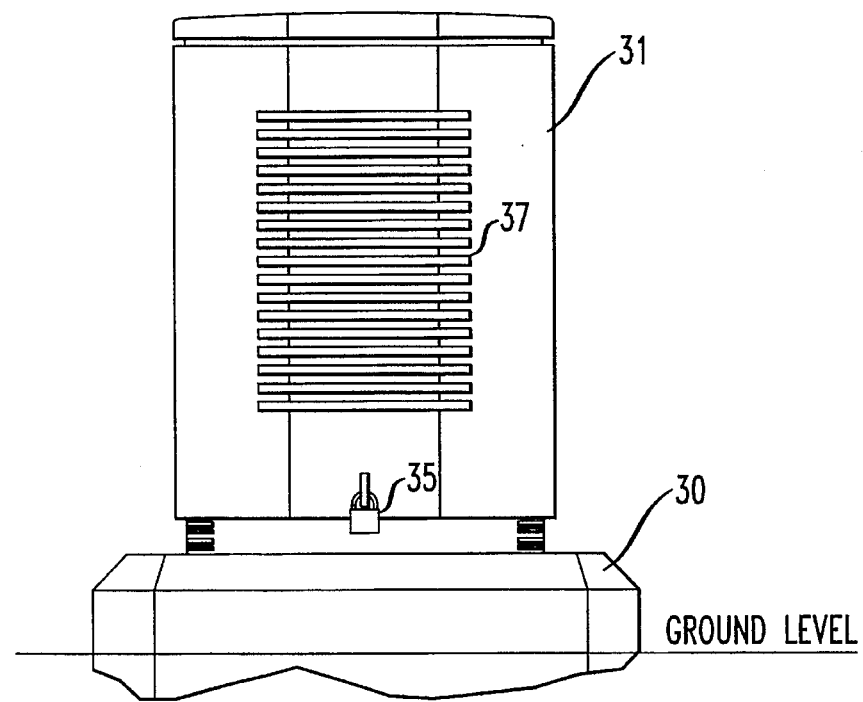
FIG. 4 is a front view of the cabinet of FIGS. 1 and 2.

The portion, 12, is enclosed by a cover, 31, which is mounted on the base, 30. The cover, 31, is then secured to the cabinet by a lock, 35 of FIG. 4, secured to a hasp, 36, so that the cabinet is accessed only by the provider's personnel. Similarly, a cover, 32, is mounted on the base, 30, so as to enclose portion 11, and is secured to the cabinet by a lock (not shown) secured to a hasp, 33.

It will be noted that the covers, 31 and 32, include a plurality of vents, e.g., 37, running in an essentially parallel, horizontal direction. In this example, 14 vents are included in a cover which measures 25×1.3 cm. Of course, this number can vary, but it is recommended that the cover have at least 75 cm$^2$ of vent opening area per 1000 cm$^2$ of enclosure surface area to ensure adequate cooling of the components in the cabinet. It will be appreciated that the covers, 31 and 32, provide both shading to minimize solar loading and security against access to the components by unauthorized personnel.

It will be appreciated further that by keeping the cross-connect apparatus and coaxial hardware in a portion which is separate from the circuit packs, the number of wires or cables fed into the sealed portion, 11, is minimized. Here, only a small diameter wire connecting the cross-connect apparatus and a single coaxial connector, 27, is needed to connect to the sealed components. If the coaxial hardware were included in the sealed portion, 11, a large number of cables, typically 30, from the field having a variety of diameters, typically 1 to 3 cm, would have to be fed into that portion and could compromise the seal.

The invention claimed is:

1. A cabinet comprising:
   a first portion which is sealed from the outside environment and includes a plurality of circuit packs mounted therein;
   a second portion adjacent to the first portion and separated therefrom by a wall, the second portion being ventilated and including therein components electrically connected to the circuit packs in the first portion; and
   a base member including a hole formed therein in the second portion of sufficient size to permit entrance of a plurality of cables into the second portion.

2. The cabinet according to claim 1 wherein the components in the second portion include coaxial cable TV hardware and a cross-connect apparatus.

3. The cabinet according to claim 2 wherein the circuit packs are adapted for broadband and narrowband telecommunications transmission.

4. The cabinet according to claim 1 wherein the components in the second portion are electrically connected to the circuit packs in the first portion through the wall.

5. The cabinet according to claim 4 wherein the second portion includes means for providing power from the second portion to the circuit packs of the first portion, and an aperture in the wall with a small diameter wire extending therethrough for providing the electrical connection between the components in the second portion and the circuit packs.

6. The cabinet according to claim 5 wherein the means for providing power comprises a coaxial connector mounted to the wall in the second portion.

7. The cabinet according to claim 1 wherein the first portion includes a hinged door which permits access to the circuit packs.

8. The cabinet according to claim 1 wherein the first portion further includes an optical fiber organizer for storing optical fibers in the first portion.

9. The cabinet according to claim 1 further comprising a first cover mounted over the first portion and a second cover mounted over the second portion, the first and second covers including locking means for preventing unauthorized access to the components and circuit packs.

* * * * *